US008605027B2

United States Patent
Pak et al.

(10) Patent No.: US 8,605,027 B2
(45) Date of Patent: Dec. 10, 2013

(54) SHIFT REGISTER, DISPLAY DEVICE HAVING THE SAME AND METHOD OF DRIVING THE SAME

(75) Inventors: Sang-Jin Pak, Yongin-si (KR); Joo-Hyung Lee, Gwacheon-si (KR); Hyung-Guel Kim, Yongin-si (KR); Myung-Woo Lee, Suwon-si (KR)

(73) Assignee: Samsung Display Co., Ltd. (KR)

( * ) Notice: Subject to any disclaimer, the term of this patent is extended or adjusted under 35 U.S.C. 154(b) by 1651 days.

(21) Appl. No.: 11/170,992

(22) Filed: Jun. 30, 2005

(65) Prior Publication Data

US 2006/0001637 A1    Jan. 5, 2006

(30) Foreign Application Priority Data

Jun. 30, 2004   (KR) .................. 10-2004-0049995
Aug. 5, 2004    (KR) .................. 10-2004-0061556

(51) Int. Cl.
*G09G 3/36* (2006.01)
(52) U.S. Cl.
USPC ............. 345/100; 345/98; 377/64; 315/169.2
(58) Field of Classification Search
USPC ............... 345/98–100; 377/64–81; 315/169.2
See application file for complete search history.

(56) References Cited

U.S. PATENT DOCUMENTS

| 5,410,583 | A | * | 4/1995 | Weisbrod et al. | 377/75 |
| 5,517,542 | A |   | 5/1996 | Huq |  |
| 7,319,452 | B2 | * | 1/2008 | Moon | 345/100 |
| 7,486,269 | B2 | * | 2/2009 | Moon | 345/100 |
| 2003/0128180 | A1 | * | 7/2003 | Kim et al. | 345/100 |
| 2004/0041774 | A1 | * | 3/2004 | Moon | 345/99 |
| 2004/0090412 | A1 | * | 5/2004 | Jeon et al. | 345/100 |
| 2005/0220263 | A1 | * | 10/2005 | Moon | 377/68 |

FOREIGN PATENT DOCUMENTS

| JP | 05-267636 A | 10/1993 |
| JP | 2001-273785 A | 10/2001 |
| JP | 2001-282169 A | 10/2001 |
| JP | 2004-078172 A | 3/2004 |
| KR | 2000-0066493 | 11/2000 |
| TW | 408333 | 10/2000 |
| TW | 588369 | 5/2004 |

* cited by examiner

*Primary Examiner* — Michael Pervan
(74) *Attorney, Agent, or Firm* — Cantor Colburn LLP

(57) ABSTRACT

A shift register includes stages to generate gate signals in sequence. Each of the stages includes a first pull up drive control section, a pull up drive section and a pull down drive section. The first pull up drive control section outputs a control signal based on the gate signal of an adjacent stage. The pull up drive section receives a first clock signal and outputs the first clock signal as the gate signal to a corresponding gate line in response to the control signal. The pull down drive section inactivates the corresponding gate line in response to a second clock signal.

39 Claims, 10 Drawing Sheets

US 8,605,027 B2

SHIFT REGISTER, DISPLAY DEVICE HAVING THE SAME AND METHOD OF DRIVING THE SAME

CLAIM FOR PRIORITY

This application claims priority under 35 U.S.C. §119 to Korean Patent Application No. 2004-49995 and Korean Patent Application No. 2004-61556, filed on Jun. 30, 2004 and Aug. 5, 2004 respectively, and all the benefits accruing therefrom under 35 U.S.C. §119, the contents of which are herein incorporated by reference in their entireties for all purposes.

BACKGROUND OF THE INVENTION

1. Field of the Invention

The present invention relates to a shift register, a display device having the shift register and a method of driving the shift register, and more particularly to a shift register capable of generating a scan signal for scanning a gate line of an active matrix thin film transistor liquid crystal display device ("AMTFT-LCD"), a display device having the shift register and a method of driving the shift register.

2. Description of the Related Art

Information processing devices have been developed to have various characteristics, such as various shapes, various functions, high speed, etc. The information processing devices generally process information using electric signals. A user of an information processing device may recognize information through a display device working as an interface tool between the user and the signals.

Such display device may be implemented with a cathode ray tube ("CRT"), a plasma display panel ("PDP"), an organic light emitting display ("OLED"), a liquid crystal display ("LCD") device, etc. The LCD devices have various characteristics, such as lighter weight, smaller size, higher resolution and lower power consumption and are generally more eco-friendly than the CRT devices. The LCD device may display images having full-color.

In an LCD device, arrangement of liquid crystal molecules varies in response to an electric field applied thereto, so that light characteristics of the liquid crystal such as birefringence, luminance, diffusion, etc. are altered.

The LCD devices would be classified into a twisted nematic ("TN") LCD, a super-twisted nematic ("STN") LCD, a homogeneous LCD, etc. based on types of the liquid crystal molecular arrangements. The LCD devices are also classified into either an active matrix LCD having a switching member or a passive matrix LCD, based on the types of driving the liquid crystal. The active matrix LCD corresponds to the TN LCD, and the passive matrix LCD corresponds to the STN LCD.

The active matrix LCD devices use a thin film transistor ("TFT") as a switching member, while the passive matrix LCD devices do not employ a switching member.

TFT LCD devices having TFTs as switching members are classified into either an amorphous-silicon ("a-Si") TFT LCD or a poly-silicon ("poly-Si") TFT LCD. The poly-Si TFT LCD devices generally have lower power consumption than the a-Si TFT LCD devices. However, the poly-Si TFT LCD devices have more complex manufacturing process than the a-Si TFT LCD devices. Therefore, the poly-Si TFT LCD devices are widely applied to small-screen display devices such as IMT-2000 cellular phones.

The a-Si TFT LCD is suitable for use in a large-screen display and has higher yield than the poly-Si TFT LCD. Therefore, the a-Si TFT LCD is widely applied to large-screen display devices, such as a notebook personal computer, an LCD monitor, a high definition television (HDTV) receiver set, etc.

FIG. 1 is a plan view showing a thin film transistor (TFT) substrate of a conventional poly-silicon liquid crystal display device ("poly-Si TFT LCD").

Referring to FIG. 1, the poly-Si TFT LCD includes a glass substrate 10, an integrated printed circuit board ("PCB") 20 and a film cable 18. A data drive circuit 12 and a gate drive circuit 14 are formed on the glass substrate 10. A terminal 16 and the glass substrate 10 are electrically connected to the integrated PCB 20 through the film cable 18. Therefore, the manufacturing cost of the poly-Si TFT LCD is decreased. In addition, the data and gate drive circuits 12 and 14 are directly formed on the glass substrate 10 so that power consumption of the poly-Si TFT LCD is decreased.

FIG. 2 is a plan view showing a TFT substrate of a conventional amorphous silicon liquid crystal display device.

Referring to FIG. 2, a data driver chip 34 is formed on a data flexible PCB 32 through a chip-on-film ("COF") process. End portions of data lines of a pixel array are electrically connected to a data PCB 36 through the data flexible PCB 32. In addition, a gate driver chip 40 is formed on a gate flexible PCB 38 through the COF process. End portions of gate lines of the pixel array are electrically connected to a gate PCB 42 through the gate flexible PCB 38.

The gate drive circuit may be mounted on the data PCB so that the gate PCB is omitted. An LCD module having an integrated PCB, which does not have a gate PCB, is disclosed in Korean Patent Laid Open Publication No. 2000-66493.

The LCD module having the integrated PCB, however, includes the gate flexible PCB, although the LCD module does not have the gate PCB. Therefore, the number of the flexible PCBs in an a-Si TFT LCD is larger than that in a poly-Si TFT LCD, so that the a-Si TFT LCD has more complex outer lead bonding ("OLB") process than the poly-Si TFT LCD, thereby increasing the manufacturing cost thereof.

A shift register of a gate drive circuit is disclosed in U.S. Pat. No. 5,517,542.

In this patent, the shift register for the gate drive circuit outputs signals using three clock signals. Each of stages of the shift register outputs an output signal using two clock signals of the three clock signals. Each of the stages is enabled using an output signal from a previous stage as an input signal. In addition, each of the stages is disabled using a feedback signal from a following stage.

To maintain a selected stage inactive, a stored charge in a capacitor is provided to a gate electrode of a pull down transistor. Therefore, when a threshold voltage of the pull down transistor exceeds the charged voltage of the capacitor as a result of over stress, the pull down transistor is erroneously turned off in the inactive state of the selected stage.

To overcome the problem, U.S. Pat. No. 5,517,542 employs a threshold voltage drift compensations circuit that increases a VDD voltage proportional to a threshold voltage drift to prevent a decrease in the conductivity of the pull down transistor.

However, a need still exists for a shift register that improves functional and operational reliability by effectively preventing or reducing deterioration of components of the shift register, and a display device employing such shift register.

SUMMARY OF THE INVENTION

Example embodiments of the present invention may provide a shift register having an improved reliability.

Example embodiments of the present invention may also provide a display device having the shift register.

Example embodiments of the present invention may also provide a method of driving the shift register.

In some example embodiments of the present invention, there is provided a shift register that includes stages to generate gate signals in sequence, each of the stages including a first pull up drive control section configured to output a control signal in response to the gate signal of an adjacent stage; a pull up drive section configured to receive a first clock signal and to output the first clock signal as the gate signal to a corresponding gate line in response to the control signal; and a pull down drive section configured to inactivate the corresponding gate line in response to a second clock signal.

In other example embodiments of the present invention, the shift register includes stages to generate gate signals in sequence, each of the stages including a first pull up drive control section configured to output a control signal in response to the gate signal of an adjacent stage; a pull up drive section configured to receive a first clock signal and to output the first clock signal as the gate signal to a corresponding gate line in response to the control signal; a pull down drive section configured to inactivate the gate line in response to a second clock signal; and a maintaining section configured to maintain an inactivated state of the gate line in response to the first clock signal.

In other example embodiments of the present invention, there is provided a display device for displaying images. The display device may include a display panel having gate lines, data lines, display members, and switching members; a timing controller configured to output image data, gate control signals, and data control signals; a shift register configured to sequentially output gate signals to the gate lines based on the gate control signals; and a data drive circuit configured to output data signals to the data lines in response to the data control signals, wherein the shift register includes stages corresponding to the gate lines, each of the stages outputting a first clock signal as the gate signal to a corresponding gate line in response to the gate signal of an adjacent stage and inactivating the corresponding gate line in response to a second clock signal.

In other example embodiments of the present invention, the display device may include a display panel having gate lines, data lines, display members, and switching members; a timing controller configured to output image data, gate control signals, and data control signals; a shift register configured to sequentially output gate signals to the gate lines based on the gate control signals; and a data drive circuit configured to output data signals to the data lines based on the data control signals, wherein the shift register includes stages corresponding to the gate lines, each of the stages outputting a first clock signal as the gate signal to a corresponding gate line in response to the gate signal of an adjacent stage, inactivating the gate line in response to a second clock signal and maintaining an inactive state of the gate line in correspondence with the first clock signal.

In still other example embodiments of the present invention, there is provided a method of driving the shift register that generates gate signals for stages of the shift register, respectively, in sequence. The method may include outputting a control signal based on the gate signal of an adjacent stage; generating a first clock signal as the gate signal to a corresponding gate line in response to the control signal; and inactivating the gate line in response to a second clock signal. The first clock signal may be externally provided to the shift register.

In still other example embodiments of the present invention, the method may include outputting a control signal in response to the gate signal of an adjacent stage; generating a first clock signal as the gate signal to activate a gate line in response to the control signal; inactivating the gate line in response to a second clock signal; and maintaining an inactive state of the gate line in response to the first clock signal.

According to the present invention, a marginal size of the display panel may be reduced using a relatively small number of switching members. In addition, the shift register may achieve an improved reliability.

BRIEF DESCRIPTION OF THE DRAWINGS

The present invention will become more apparent to those of ordinary skill in the art by describing, in detail, example embodiments thereof with reference to the attached drawings, wherein like members are represented by like reference numerals, which are given by way of illustration only and thus do not limit the example embodiments of the present invention.

DETAILED DESCRIPTION OF THE INVENTION

Figure 1:
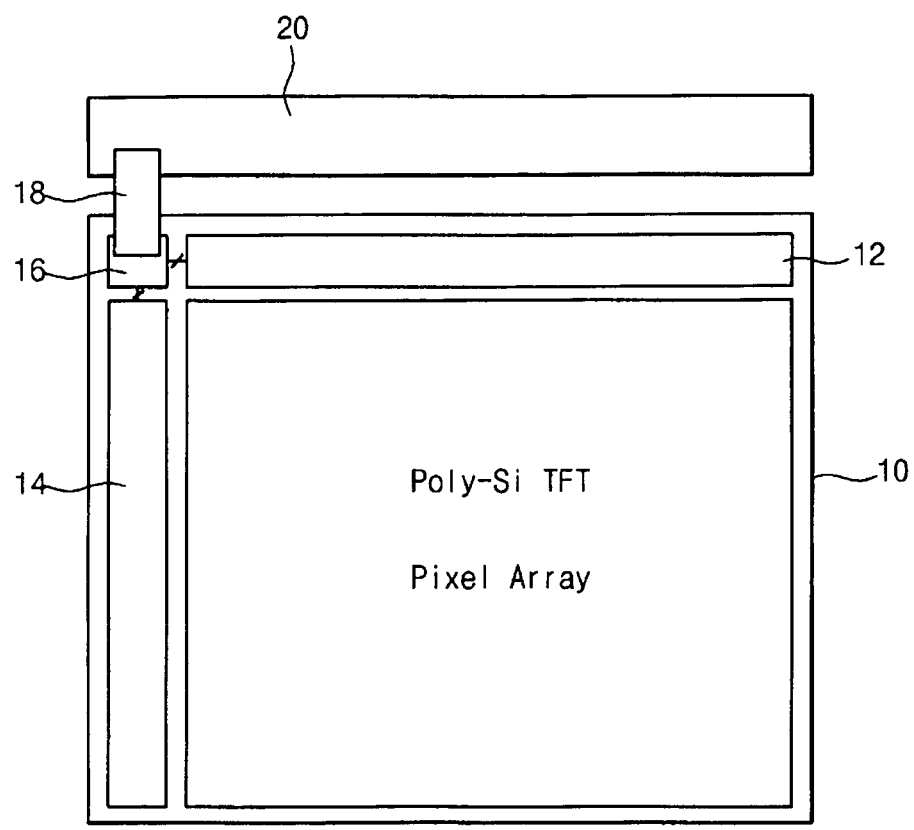
FIG. 1 is a plan view showing a thin film transistor ("TFT") substrate of a conventional poly-silicon liquid crystal display device.
Figure 2:
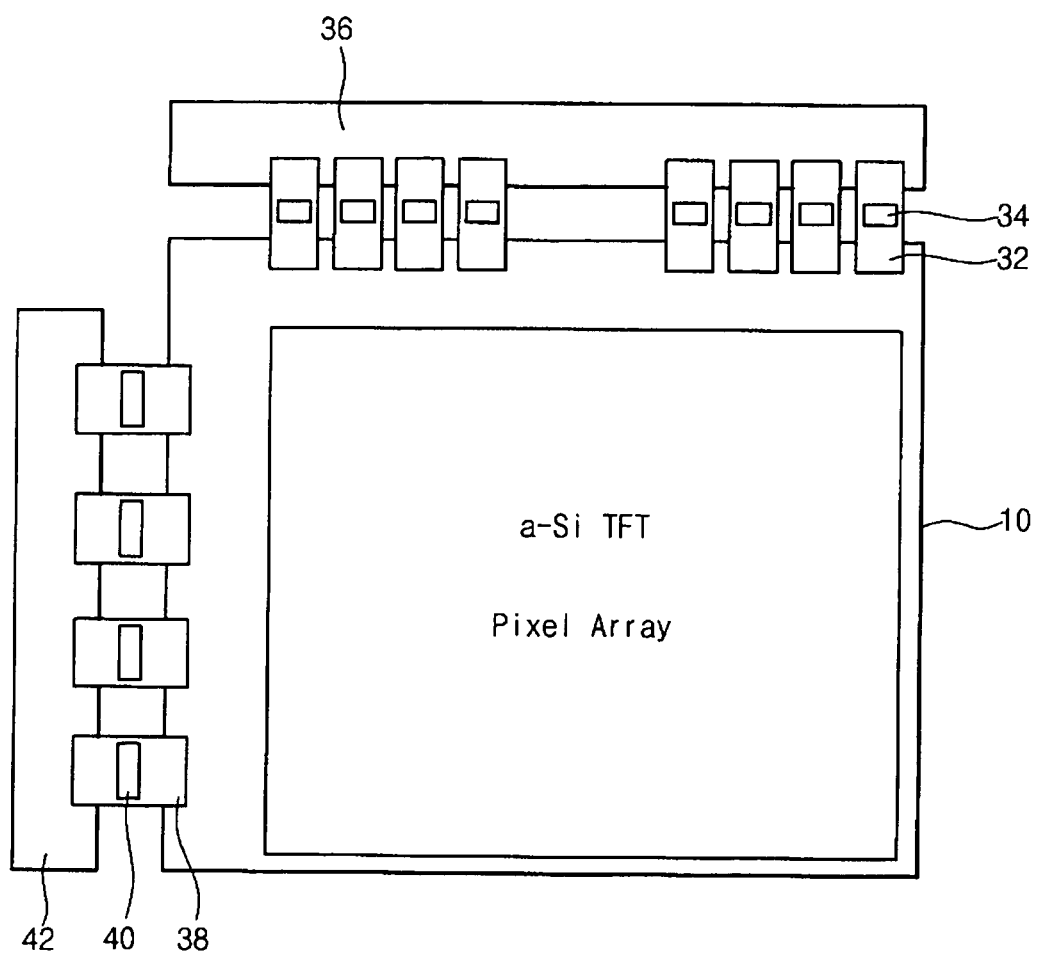
FIG. 2 is a plan view showing a TFT substrate of a conventional amorphous silicon liquid crystal display device.

The present invention will become more apparent to those of ordinary skill in the art by describing, in detail, example embodiments thereof with reference to the attached drawings, wherein like members are represented by like reference numerals, which are given by way of illustration only and thus do not limit the example embodiments of the present invention.

Figure 3:
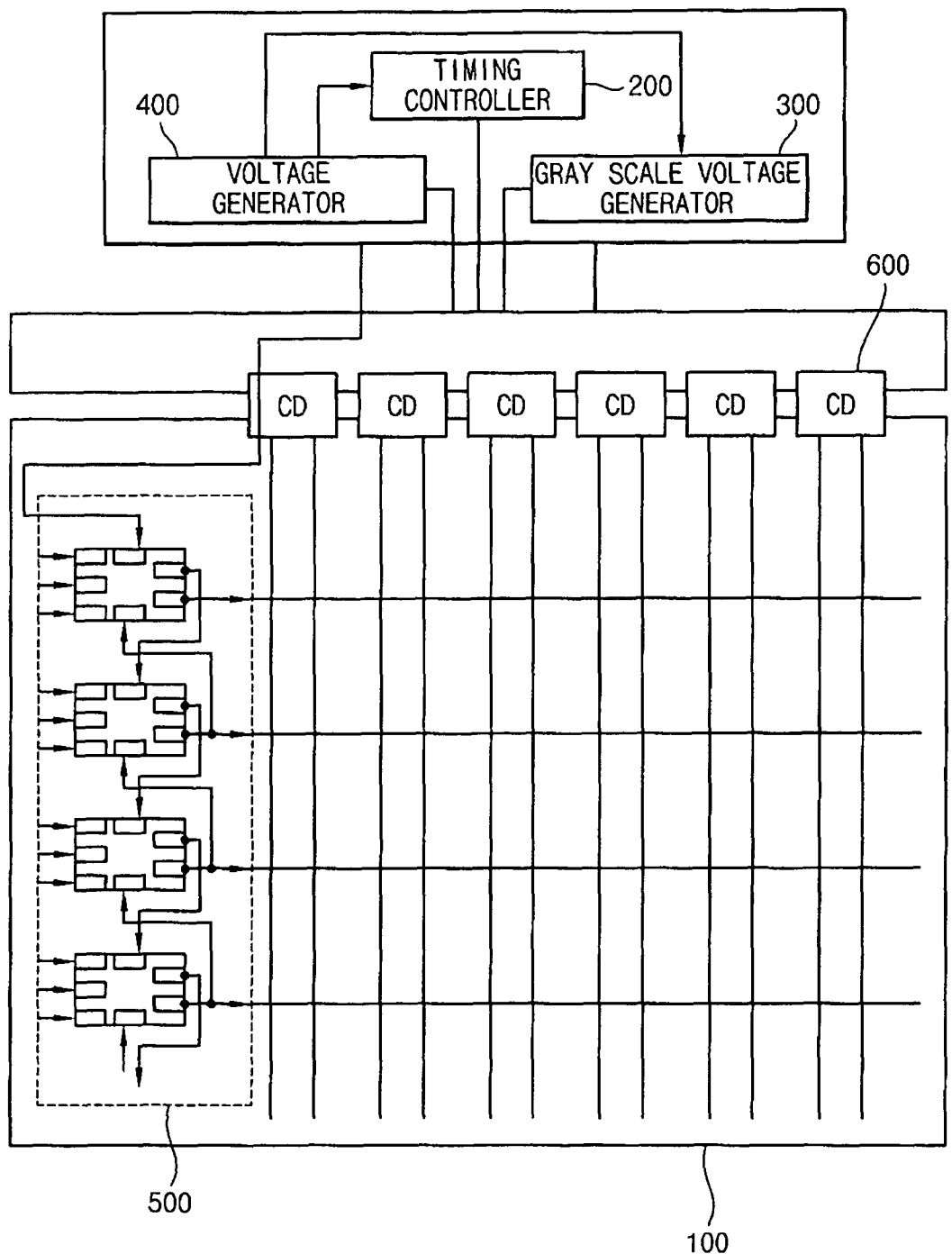
FIG. 3 is a plan view illustrating a display device having a shift register according to an example embodiment of the present invention.

FIG. 3 is a schematic view illustrating a display device having a shift register according to an example embodiment of the present invention.

Referring to FIG. 3, the display device includes a display panel 100, a timing controller 200, a gray scale voltage generator 300, a voltage generator 400, a shift register 500 and a data drive circuit 600.

The timing controller 200 receives digital image data and control signals from an external source, to generate various control signals for the shift register 500 and the data drive circuit 600. The digital image data is provided to the data drive circuit (CD) 600 based on the control signals.

The control signals are provided to the shift register 500 from the timing controller 200 along a wiring in the display panel 100 via, for example, a flexible printed cable ('FPC') or a tape carrier package ('TCP'). For example, the control signals may be applied to a first terminal of the shift register along the wiring in the display panel 100 via an end portion of the FPC or the TCP where the data drive circuit (CD) 600 is formed.

The data drive circuit (CD) 600 converts the digital image data outputted from the timing controller 200 into an analog voltage based on the control signals to provide the analog voltage to a plurality of data lines formed on the display panel 100.

The shift register 500 generates a driving pulse (i.e., gate signal) for controlling a plurality of gate lines formed on the display panel 100.

The voltage generator 400 provides power supply for the timing controller 200, the gray scale voltage generator 300, the shift register 500 and the data drive circuit 600. For example, the voltage generator 400 produces a digital power voltage ('DVDD'), an analog power voltage ('AVDD'), a gate turn-on voltage and a gate turn-off voltage ('VON', 'VOFF'). The gate turn-off voltage VOFF may have a ground voltage level or a negative voltage level.

The display panel 100 includes gate lines, data lines, display members and switching members for controlling the display members.

The gray scale voltage generator 300 generates a reference voltage for displaying a color based on an analog voltage provided from an external source. Generally, the number of the reference voltages is determined by characteristics of the display device, for example, resolution, size, etc.

Figure 4:
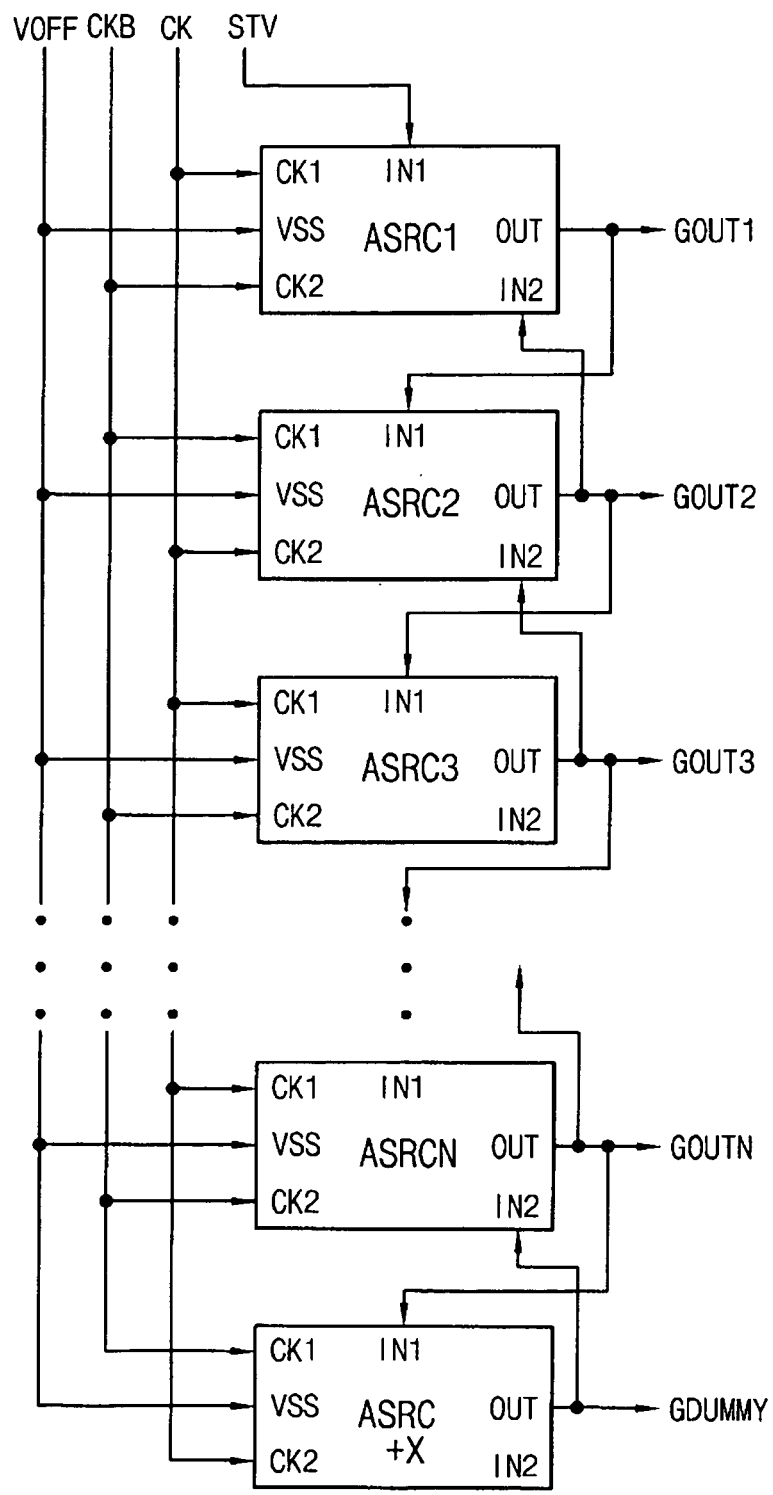
FIG. 4 is a block diagram illustrating a shift register according to an example embodiment of the present invention.

FIG. 4 is a block diagram illustrating a shift register according to an example embodiment of the present invention.

Referring to FIG. 4, the shift register 500 includes N stages ASRC1, ASRC2, . . . and ASRCN for outputting N gate signals (or scan signal) GOUT1, GOUT2, GOUT3, . . . and GOUTN and a dummy stage ASRC+X for outputting the dummy gate signal GDUMMY.

The dummy stage ASRC+X may output the dummy gate signal GDUMMY to a preceding stage ASRCN, thereby controllably inactivating the preceding stage ASRCN. Alternatively, the dummy stage ASRC+X may output the dummy gate signal GDUMMY to all the N stages ASRC1, ASRC2, . . . ASRCN, thereby controllably inactivating all the stages ASRC1, ASRC2, . . . ASRCN.

The shift register 500 may be formed on the display panel 100. The display panel 100 has switching members (not shown) each formed on a region that is defined by each of the gate lines and each of the data lines.

The first stage ASRC1 of the shift register 500 receives a first and a second clock signals CK and CKB through a first and a second clock terminals CK1 and CK2, respectively. The clock signals CK and CKB are provided from a clock generator (not shown). The first stage ASRC1 also receives a start scan signal STV through the first control terminal IN1, and a gate signal GOUT2 of a second stage ASRC2 through the second control terminal IN2 thereof.

The first stage ASRC1 of the register 500 outputs a gate signal GOUT1 to a first gate line via an output terminal OUT of the first stage ASRC1. In this embodiment, the first stage ASRC1 outputs the gate signal GOUT1 and the first voltage VOFF (or VSS).

The gate signal GOUT1 from the first state ASRC1 is provided to the first control terminal IN1 of the second stage ASRC2. The clock generator (not shown) generates clock signals having different phases from each other. For example, when the shift register uses two clock signals, the two clock signals may have opposite phases. Further, when the shift register uses three clock signals, the clock signals may have different phases and phase delay. The VSS voltage may correspond to a ground voltage level or a negative voltage level.

The second stage ASRC2 of the shift register 500 receives the first and second clock signals CK and CKB from the clock generator (not shown) through the second and first clock terminals CK2 and CK1, respectively. The second stage ASRC2 also receives the gate signal GOUT1 of the first stage ASRC1 and a gate signal GOUT3 of a third stage ASRC3 through the first and second control terminals IN1 and IN2, respectively.

The second stage ASRC2 outputs the gate signal GOUT2 to a second gate line via an output terminal OUT of second stage ASRC2. In this embodiment, the second stage ASRC2 outputs the gate signal GOUT2 and the first voltage VOFF (or VSS) to the second gate line. The second stage ASRC2 also outputs the gate signal GOUT2 to a first control terminal IN1 of the third stage ASRC3.

The Nth stage ASRCN receives the first and second clock signals CK and CKB from the clock generator (not shown) through the first and second clock terminals CK1 and CK2, and a gate signal GOUTN−1 of a preceding stage ASRCN−1 through the first control terminal IN1 thereof. Also, the Nth stage ASRCN receives the dummy gate signal GDUMMY of the dummy stage ASRC+X through a second control terminal IN2 thereof.

The Nth stage ASRCN outputs a gate signal GOUTN to an Nth gate line via an output terminal OUT of Nth stage ASRCN. In this embodiment, the Nth stage ASRCN outputs the gate signal GOUTN and the first voltage VOFF (or VSS) to the Nth gate line. The Nth stage ASRCN also outputs the gate signal GOUTN to the first control terminal IN1 of the dummy stage GDUMMY.

The first and second clock signals CK and CKB are alternately applied to the first and second clock terminals CK1 and CK2 of the respective stages of the shift register 500. For example, the first clock signal CK is applied to the first clock terminal CK1 of the first stage ASRC1 and the second clock signal CKB is applied to the second clock terminal CK2 of the first stage ASRC1. The first clock signal CK is also applied to the second clock terminal CK2 of the second stage ASRC2 and the second clock signal CKB is applied to the first clock terminal CK1 of the second stage ASRC2.

Figure 5:
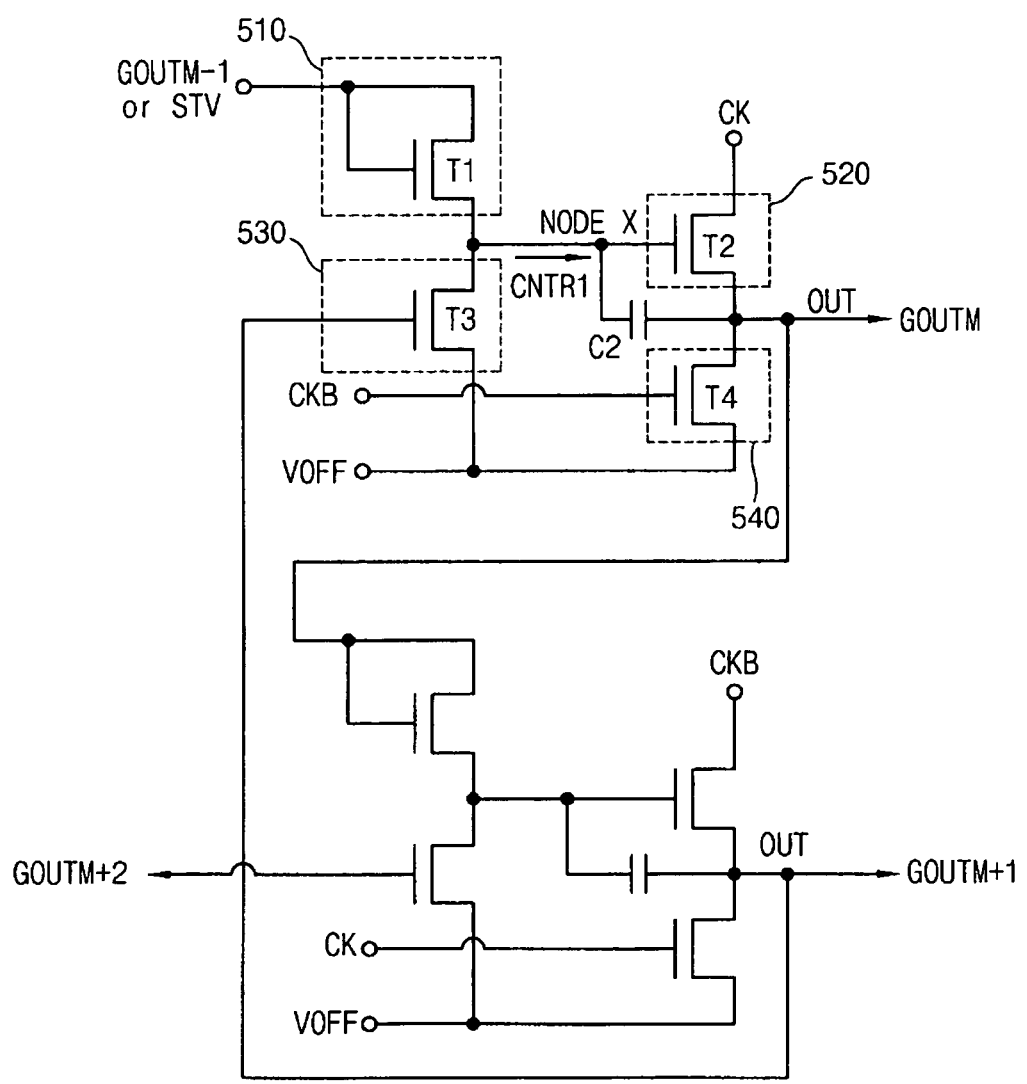
FIG. 5 is a circuit diagram illustrating an example stage of the shift register in FIG. 4 according to an example embodiment of the present invention.

FIG. 5 is a circuit diagram illustrating an example stage of the shift register in FIG. 4 according to an example embodiment of the present invention.

Referring to FIG. 5, the example stage (e.g., Mth stage) of the shift register 500 includes a first pull up drive control section 510, a pull up drive section 520, a second pull up drive control section 530 and a pull down drive section 540.

The first pull up drive control section 510 includes a first switching element that is implemented with, for example, a first transistor T1 whose drain electrode and gate electrode are commonly connected to each other. The first transistor T1 receives a gate signal GOUTM−1 from the M−1th stage and outputs a first control signal CNTR1 to a node X. Assuming that the Mth stage is the first stage, the start scan signal STV is applied to the first transistor T1 of the first pull up drive control section 510. The first transistor T1, for example, is an NMOS transistor.

The pull up drive section 520 includes a second switching element that is implemented with, for example, a second transistor T2 of which gate electrode is connected to the node X and controlled by the first control signal CNTR1. A drain electrode of the second transistor T2 receives the first clock signal CK, and a source electrode thereof is connected to the pull down drive section 540 and an output terminal OUT of the Mth stage.

Additionally, a first capacitor C1 (not shown) is coupled between the drain electrode and the gate electrode of the second transistor T2. A second capacitor C2 is coupled between the gate electrode and the source electrode of the second transistor T2. The first capacitor C1 and the second capacitor C2 may correspond to a parasitic capacitor or an additionally installed capacitor.

For example, the second capacitor C2 stores an electric charge corresponding to the first control signal CNTR1 at the node X to perform a boot-strap operation so that an overlap area between the gate electrode and the source electrode of the second transistor T2 is larger than an overlap area between the gate electrode and the drain electrode. Therefore, the second capacitor C2 has capacitance greater than the capacitance of the first capacitor C1 (not shown). The second transistor T2, for example, is an NMOS transistor.

The second pull up drive control section 530 includes a third switching element that implemented, for example, a third transistor T3 of which gate electrode receives a gate signal GOUTM+1 from an output terminal OUT of an M+1th stage. A drain electrode of the third transistor T3 is connected to the node X and the gate electrode of the second transistor T2. A source electrode of the third transistor T3 is connected to the first voltage VOFF (or VSS).

When the output signal GOUTM+1 outputted from the output terminal OUT of the M+1th stage ASRCM+1 is applied to the gate electrode of the third transistor T3 to thereby turn on third transistor T3, the first voltage VOFF (or VSS) may control the gate electrode of the second transistor T2 through the third transistor T3. The third transistor T3 may be implemented with an NMOS transistor.

The output terminal OUT of the Mth stage is connected to a first pull up drive control section of the M+1th stage and a second pull up drive control section 530 of the M−1th stage.

The gate signal GOUTM of the Mth stage ASRCM is outputted to an Mth gate line through the output terminal OUT of the Mth stage ASRCM.

The pull down drive section 540 includes a fourth switching element that is implemented with, for example, a fourth transistor T4. The second clock signal CKB is applied to a gate electrode of the fourth transistor T4 and a source electrode is connected to the first voltage VOFF (or VSS). A drain electrode of the fourth transistor T4 is connected to the source electrode of the second transistor T2 of the pull up drive section 520 and the output terminal OUT of the Mth stage.

The pull down drive section 540 is controlled by the second clock signal CKB to inactivate the output terminal OUT. The second clock signal CKB is used as a control signal of the gate electrode of the fourth transistor T4. Such configuration may prevent the fourth transistor T4 from being deteriorated.

The first and second clock signals CK and CKB are alternately applied to the first and second clock terminals CK1 and CK2 of the respective stages ASRC1, ASRC2, . . . ASRCN, and ASRC+X.

In this embodiment, each of the stages ASRC1, ASRC2, . . . ASRCN and ASRC+X receives the output signals GOUT1, GOUT2, . . . GOUTN, and GDUMMY outputted from the nearest stages (i.e., preceding stage and/or the next stage). It should be noted that in other embodiments, each of the stages ASRC1, ASRC2, ASRCN, and ASRC+X may receive the output signals GOUT1, GOUT2, . . . GOUTN, and GDUMMY outputted from any preceding and/or following stages. For example, an Mth stage may receive an output signal GOUTM+2 outputted from an M+2th stage and/or an output signal GOUTM−2 outputted from an M−2th stage.

Figure 6:
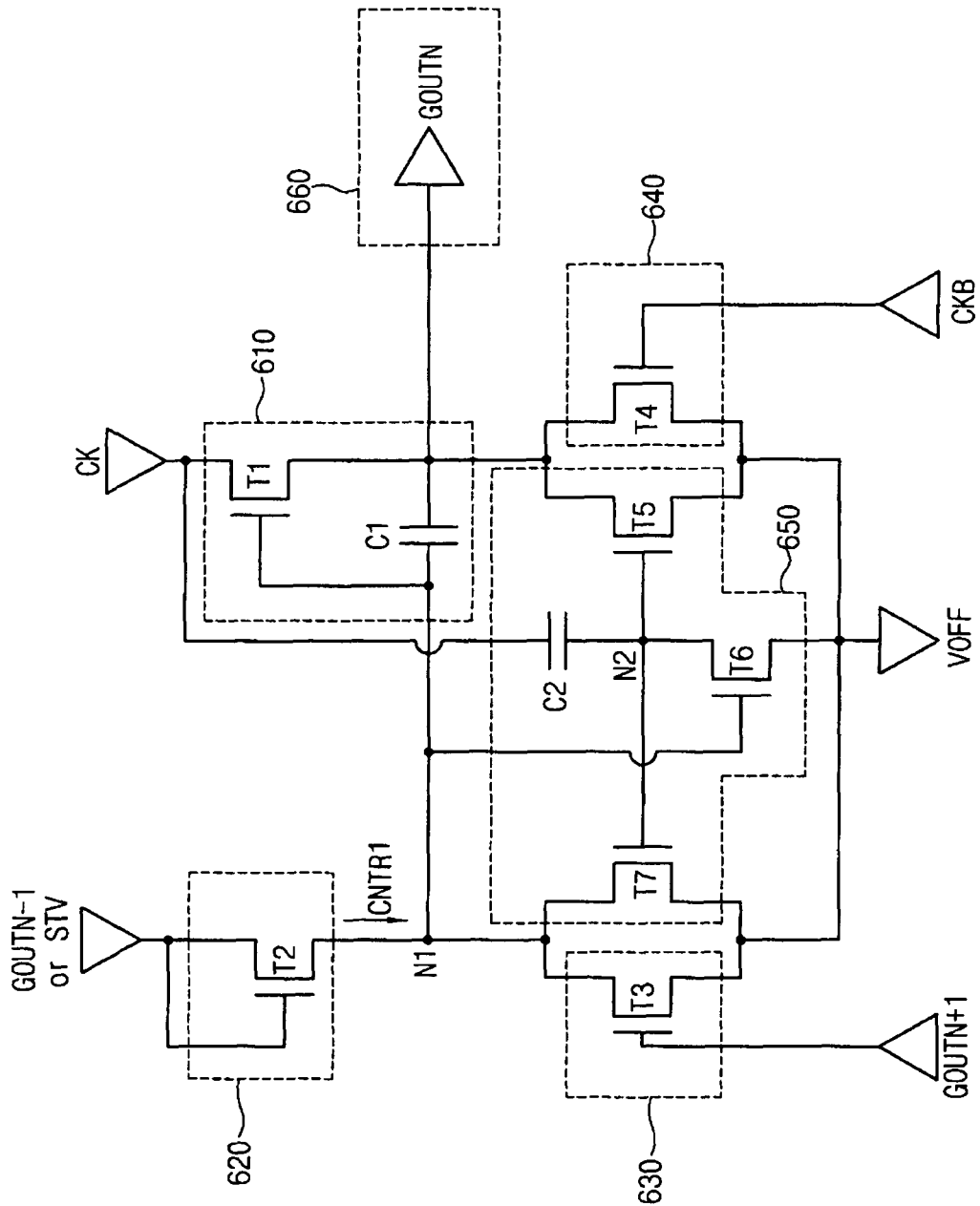
FIG. 6 is a circuit diagram illustrating an example stage of the shift register in FIG. 4 according to another example embodiment of the present invention.

FIG. 6 is a circuit diagram illustrating an example stage of the shift register in FIG. 4 according to an example embodiment of the present invention.

Referring to FIG. 6, the example stage (e.g., Nth stage) of the shift register 500 includes a pull up drive section 610, a first pull up drive control section 620, a second pull up drive control section 630, a pull down drive section 640 and a maintaining section 650.

The pull up drive section 610 may include a first switching element, for example, a first transistor T1 whose drain electrode receives the first clock signal CK and whose source electrode is connected to the output terminal 660 of the Nth stage of the register 500. A gate electrode of the first transistor T1 is connected to a node N1, thereby being controlled by a first control signal CNTR1.

In addition, a first capacitor C1 is coupled between the source electrode and the gate electrode of the first transistor T1. The first capacitor C1 may correspond to a parasitic capacitor or an additionally installed capacitor. For example, the first capacitor C1 stores an electric charge corresponding to the first control signal CNTR1 at the node N1 to perform a boot-strap operation so that an overlap area between the gate electrode and the source electrode of the first transistor T1 is larger than an overlap area between the gate electrode and the drain electrode thereof. The first transistor T1 may be implemented with an NMOS transistor.

The first pull up drive control section 620 includes a second switching element, for example, a second transistor T2 whose drain electrode and gate electrode are commonly connected to each other. The second transistor T2 receives a gate signal GOUTN−1 of an N−1th stage and outputs the control signal CNTR1 to the node N1. Assuming that the Nth stage is the first stage, the start scan signal STV is applied to the second transistor T2 of the first pull up drive control section 620. The second transistor T2 may be implemented with an NMOS transistor.

The second pull up drive control section 630 includes a third transistor T3. A gate electrode of the third transistor T3 receives a gate signal GOUTN+1 outputted from an output terminal of an N+1th stage. A drain electrode of the third transistor T3 is connected to the node N1 and the gate electrode of the first transistor T1. A source electrode of the third transistor T3 is connected to the first voltage VOFF (or VSS).

When the third transistor T3 is turned on in response to the gate signal GOUTN+1 from the output terminal of the N+1th stage, the first voltage VOFF (or VSS) is provided to the node N1. The third transistor T3 may be implemented with an NMOS transistor.

The output terminal 660 of the Nth stage of the register 500 is connected to a first pull up drive control section of the N+1th stage and a second pull up drive control section of the N−1th stage.

The gate signal GOUTN of the Nth stage is outputted to an Nth gate line through the output terminal OUT of the Nth stage.

The pull down drive section 640 includes a fourth switching element, for example, a fourth transistor T4. A gate electrode of the fourth transistor T4 receives the second clock signal CKB and a source electrode is connected to the first voltage VOFF (or VSS). A drain electrode of the fourth transistor T4 is connected to the source electrode of the first transistor T1 of the pull up drive section 610 and the output terminal 660.

The pull down drive section 640 is controlled by the second clock signal CKB to inactivate the output terminal 660 (i.e., gate line). The second clock signal CKB that is an AC pulse signal rather than a DC signal is used as a control signal of the gate electrode of the fourth transistor T4, so that the fourth transistor T4 may be prevented from being deteriorated. The fourth transistor T4 may be implemented with an NMOS transistor.

The maintaining section 650 includes switching elements, such as a fifth transistor T5, a sixth transistor T6 and a seventh transistor T7, and a second capacitor C2. Each gate electrode of the fifth and seventh transistors T5 and T7 is connected to a node N2, and a gate electrode of the sixth transistor T6 is connected to the node N1. Each source electrode of the fifth to seventh transistors T5-T7 is connected at the first voltage VOFF (or VSS).

The first clock signal CK is applied to one end of the second capacitor C2. Each gate electrode of the fifth and seventh transistors T5 and T7 is electrically connected to a drain electrode of a sixth transistor T6 at the node N2. Therefore, when the sixth transistor T6 is turned on, the fifth and seventh transistors T5 and T7 are turned off in response to the first voltage VOFF (or VSS).

When the sixth transistor T6 is turned off, the fifth and seventh transistors T5 and T7 are turned on in response to the first clock signal CK that is charged in the second capacitor C2, thereby outputting the first clock signal CK to the node N1 and the output terminal 660.

The maintaining section 650 preserves an output of the first clock signal CK (as the gate signal GOUTN) to an Nth gate line until an N+1th gate line is activated. That is, the maintaining section 650 prevents the gate line from receiving a malfunction signal until the next scanning cycle.

In addition, since an AC pulse of the second clock signal CKB is applied to the gate electrode of the fourth transistor T4 of the pull down drive section 640, the deterioration of the fourth transistor T4 that is caused by a DC voltage is effectively reduced.

Therefore, a gate signal GOUTN from the output terminal 660 is maintained by operation of the fourth and fifth transistors T4 and T5 that are turned on in response to the second and first clock signals CKB and CK, respectively.

The first and second clock signals CK and CKB are alternately applied to the first and second clock terminals CK1 and CK2 of the respective stages ASRC1, ASRC2, ... ASRCN, and ASRC+X.

In this embodiment, each of the stages ASRC1, ASRC2, ... ASRCN, and ASRC+X receives the output signals GOUT1, GOUT2, ... GOUTN, and GDUMMY outputted from the nearest stages (i.e., preceding stage and/or the next stage). It should be noted that in either embodiments, each of the stages ASRC1, ASRC2, . . . ASRCN, and ASRC+X may receive the output signals GOUT1, GOUT2, ... GOUTN, and GDUMMY outputted from any preceding and/or following stages. For example, Mth stage may receive an output signal GOUTM+2 outputted from an M+2th stage and/or an output signal GOUTM−2 outputted from an M−2th stage.

Figure 7:
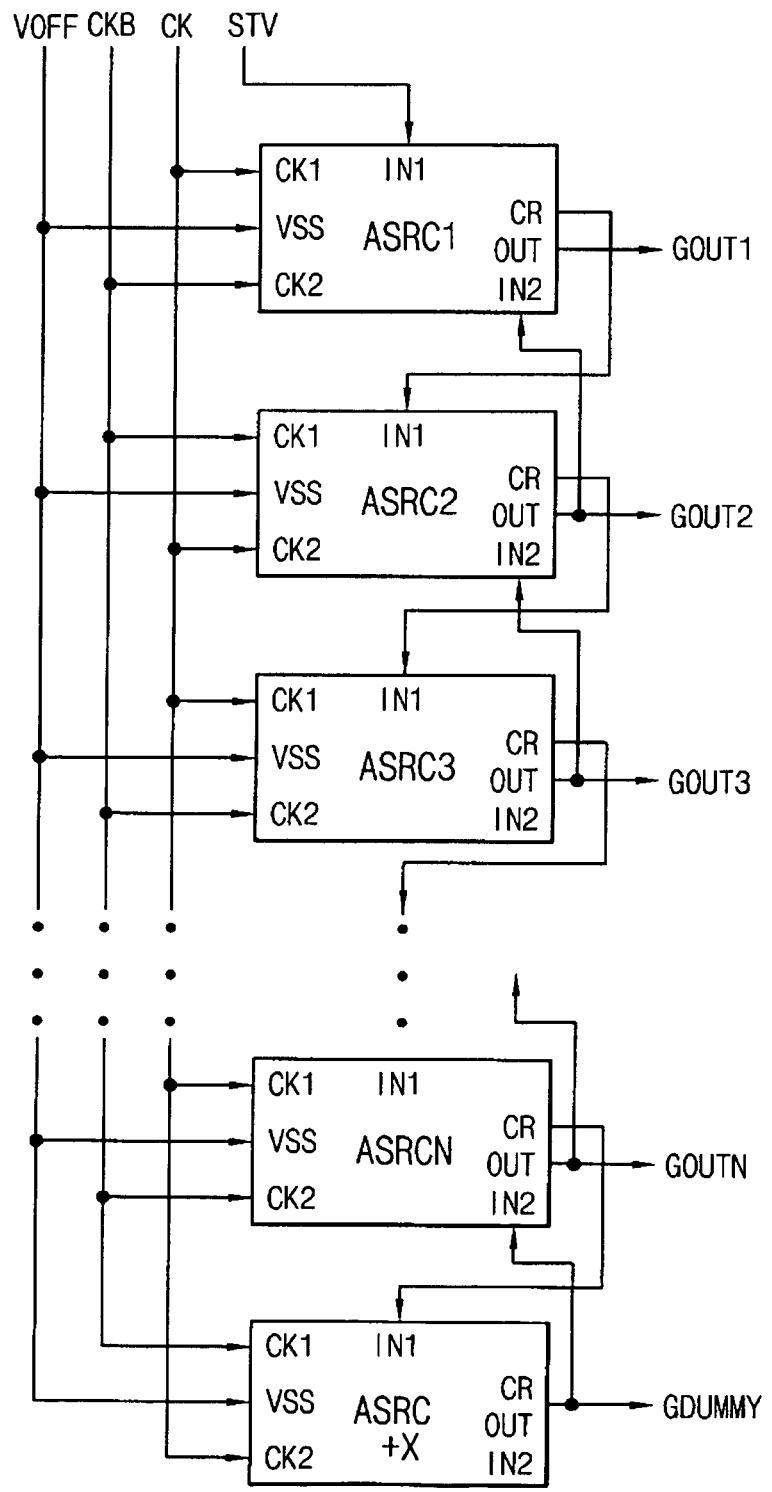
FIG. 7 is a block diagram illustrating a shift register according to another example embodiment of the present invention.

FIG. 7 is a block diagram illustrating a shift register according to another example embodiment of the present invention.

Referring to FIG. 7, the shift register 700 includes N stages ASRC1, ASRC2, . . . and ASRCN for outputting N gate signals (or scan signal) GOUT1, GOUT2, GOUT3, . . . and GOUTN, and a dummy stage ASRC+X for outputting a dummy gate signal GDUMMY.

The dummy stage ASRC+X may output the dummy gate signal GDUMMY to a preceding stage ASRCN, thereby controllably inactivating the preceding stage ASRCN. Alternatively, the dummy stage ASRC+X may output the dummy gate signal GDUMMY to all the N stages ASRC1, ASRC2, . . . , ASRCN, thereby controllably inactivating all the stages ASRC1, ASRC2, . . . , ASRCN.

The shift register 700 may be formed on the display panel 100 (referring to FIG. 3).

A clock generator (not shown) for generating a plurality of clock signals provides a first clock signal CK and a second clock signal CKB to the first stage ASRC1 of the shift register 700 through the first and second clock terminals CK1 and CK2, respectively.

The first stage ASRC1 may receive the start scan signal STV and a gate signal GOUT2 of the second stage ASRC2 through the first and second control terminals IN1 and IN2, respectively.

The first stage ASRC1 of the shift register 700 outputs a gate signal GOUT1 and a first voltage VOFF (or VSS) to a first gate line via an output terminal OUT of the first stage ASRC1. The first stage ASRC1 also outputs a carry signal to the first control terminal IN1 of the second stage ASRC2 via a carry terminal CR based on the first clock signal CK.

The second clock signal CKB is applied to the first clock terminal CK1 of the second stage ASRC2 of the shift register 700 and the first clock signal CK is applied to the second clock terminal CK2 of the second stage ASRC2. The carry signal outputted from the first stage ASRC1 is applied to the first control terminal IN1 of the second stage ASRC2. A gate signal GOUT3 outputted from a third stage ASRC3 is applied to a second control terminal IN2 of the second stage ASRC2.

The second stage ASRC2 outputs the gate signal GOUT2 and a first voltage VOFF (or VSS) to a second gate line via an output terminal OUT of second stage ASRC2. The second stage ASRC2 also outputs the carry signal to the first control terminal IN1 of the third stage ASRC3 via the carry terminal CR based on the second clock signal CKB.

Thus, the Nth stage ASRCN receives the first and second clock signals CK and CKB through the first and second clock terminals CK1 and CK2, respectively.

Also, the carry signal outputted from the preceding stage ASRCN−1 is applied to the first control terminal IN1 of the Nth stage ASRCN, and the dummy gate signal GDUMMY outputted from the dummy stage ASRC+X is applied to a second control terminal IN2 thereof. The Nth stage ASRCN outputs the gate signal GOUTN and the first voltage VOFF (or VSS) to the Nth gate line via the output terminal OUT of the Nth stage ASRCN. The Nth stage ASRCN also outputs the carry signal to the first control terminal IN1 of the dummy stage GDUMMY.

The carry signal is generated based on the first clock signal CK so that the gate signal GOUTN of the Nth stage for an Nth gate line, which would have been delayed by a load of the gate line, etc., is prevented from being applied to an input terminal of a next stage.

The first and second clock signals CK and CKB are alternately applied to the first and second clock terminals CK1 and CK2 of the respective stages ASRC1, ASRC2, . . . ASRCN, and ASRC+X.

In this embodiment, each of the stages ASRC1, ASRC2, . . . ASRCN, and ASRC+X receives the output signals GOUT1, GOUT2, . . . , GOUTN and GDUMMY outputted from the nearest stages (i.e., preceding stage and/or the next stage).

However, in other embodiments, each of the stages ASRC1, ASRC2, . . . ASRCN and ASRC+X may receive the output signals GOUT1, GOUT2, . . . GOUTN and GDUMMY outputted from any preceding and/or following stages. For example, Mth stage may receive an output signal GOUTM+2 outputted from an M+2th stage and/or an output signal GOUTM−2 outputted from an M−2th stage.

Figure 8:
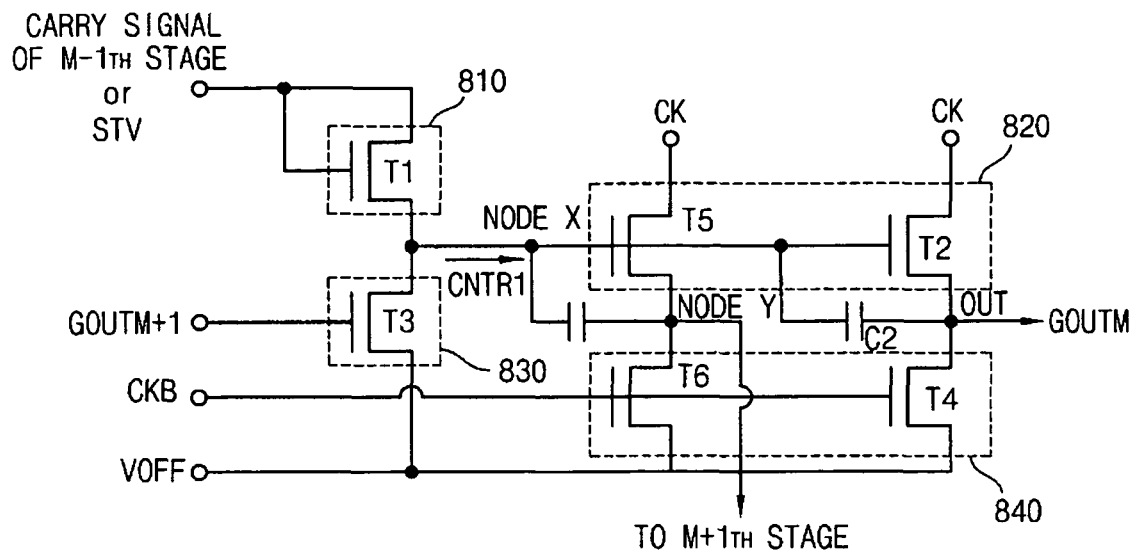
FIG. 8 is a circuit diagram illustrating an example stage of the shift register in FIG. 7 according to an example embodiment of the present invention.

FIG. 8 is a circuit diagram illustrating an example stage of the shift register in FIG. 7 according to an example embodiment of the present invention.

Referring to FIG. 8, the example stage (e.g., Mth stage) of the shift register 700 includes a first pull up drive control section 810, a pull up drive section 820, a second pull up drive control section 830, and a pull down drive section 840.

The first pull up drive control section 810 includes a first switching element, for example, a first transistor T1 whose drain electrode and gate electrode are commonly connected to each other. The first transistor T1 receives a carry signal of an M−1th stage to output a first control signal CNTR1 to a node X. Assuming that the Mth stage is the first stage, the start scan signal STV is applied to the first transistor T1 of the first pull up drive control section 810. The first transistor T1 may be implemented with an NMOS transistor.

The pull up drive section 820 includes switching elements, such as a second transistor T2 and a fifth transistor T5. Gate electrodes of the second and fifth transistors T2 and T5 are connected to the node X and controlled by the first control signal CNTR1. The first clock signal CK is applied to drain electrodes of the second and fifth transistors T2 and T5. A source electrode of the second transistor T2 is electrically connected to an output terminal OUT of the Mth stage, and a source electrode of the fifth transistor T5 is connected to the pull up drive section of an M+1th stage.

The fifth transistor T5 generates a carry signal based on the first clock signal CK. The fifth transistor T5 directly outputs the carry signal to a first control terminal of the M+1th stage, so that a gate signal GOUTM of the Mth stage for an Mth gate line, which would have been delayed by a load of the gate line, etc., is prevented from being applied to the input terminal of the M+1th stage.

Additionally, a first capacitor C1 (not shown) is coupled between the drain electrode and the gate electrode of the second transistor T2. A second capacitor C2 is coupled between the gate electrode and the source electrode of the second transistor T2. The first capacitor C1 and the second capacitor C2 may correspond to a parasitic capacitor or an additionally installed capacitor. For example, the second capacitor C2 stores an electric charge corresponding to the first control signal CNTR1 at the node X to perform a bootstrap operation, so that an overlap area between the gate electrode and the source electrode of the second transistor T2 is larger than an overlap area between the gate electrode and the drain electrode. Therefore, the second capacitor C2 has capacitance greater than the capacitance of the first capacitor C1 (not shown). The second transistor T2 may be implemented with an NMOS transistor.

The second pull up drive control section 830 includes a switching element, for example, a third transistor T3. A gate electrode of the third transistor T3 receives a gate signal GOUTM+1 outputted from an output terminal OUT of the M+1th stage. A drain electrode of the third transistor T3 is electrically connected to the node X and thereby connected to the gate electrodes of the second and fifth transistors T2 and T5. A source electrode of the third transistor T3 is connected to the first voltage VOFF (or VSS).

When the output signal GOUTM+1 outputted from the output terminal OUT of the M+1th stage ASRCM+1 is applied to the gate electrode of the third transistor T3 to thereby turn on third transistor T3, the first voltage VOFF (or VSS) may control the gate electrode of the second transistor T2 and the fifth transistor T5 through the third transistor T3. The third transistor T3 may be implemented with an NMOS transistor.

The output terminal OUT of the Mth stage is connected to a second pull up drive control section of the M−1th stage and the gate signal GOUTM of the Mth stage is outputted to an Mth gate line through the output terminal OUT of the Mth stage.

The pull down drive section 840 includes switching elements, such as a fourth transistor T4 and a sixth transistor T6. The second clock signal CKB is applied to gate electrodes of the fourth and sixth transistors T4 and T6 and the first voltage VOFF (or VSS) is applied to source electrodes of the fourth and sixth transistors T4 and T6. A drain electrode of the fourth transistor T4 is connected to the source electrode of the second transistor T2 of the pull up drive section 820 and the output terminal OUT of the Mth stage. A drain electrode of the sixth transistor T6 is connected to a node Y. The pull down drive section 840 is controlled by the second clock signal CKB to inactivate the output terminal OUT and the node Y. The second clock signal CKB is used to control the gate electrode of the fourth and sixth transistors T4 and T6. Such configuration effectively prevents the fourth and sixth transistors T4 and T6 from being deteriorated.

The first and second clock signals CK and CKB are alternately applied to the first and second clock terminals CK1 and CK2 of each of the stages ASRC1, ASRC2, . . . ASRCN and ASRC+X. In this embodiment, each of the stages ASRC1, ASRC2, . . . ASRCN and ASRC+X receives the output signals GOUT1, GOUT2, . . . , GOUTN and GDUMMY outputted from the nearest stages (i.e., preceding stage and/or the next stage). However, in other embodiments, each of the stages ASRC1, ASRC2, . . . ASRCN and ASRC+X may receive the output signals GOUT1, GOUT2, . . . GOUTN and GDUMMY outputted from any preceding and/or following stages. For example, the Mth stage may receive an output signal GOUTM+2 outputted from an M+2th stage and/or an output signal GOUTM−2 outputted from an M−2th stage.

Figure 9:
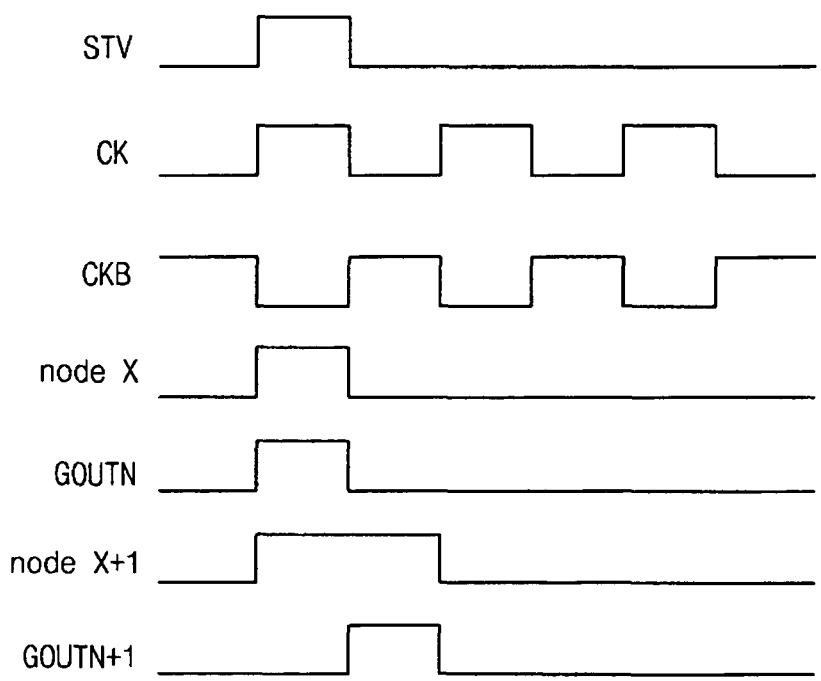
FIG. 9 is a timing diagram illustrating signals of the shift register in FIG. 8.

FIG. 9 is a timing diagram illustrating signals of the shift register in FIG. 8.

Referring to FIG. 9, gate signals GOUTM and GOUTM+1 of stages of the shift register are generated in synchronization with first and second clock signals CK and CKB. In FIG. 9, a node X+1 represents a signal at a node of a following M+1th stage corresponding to the node X of the Mth stage in FIG. 8.

Figure 10:
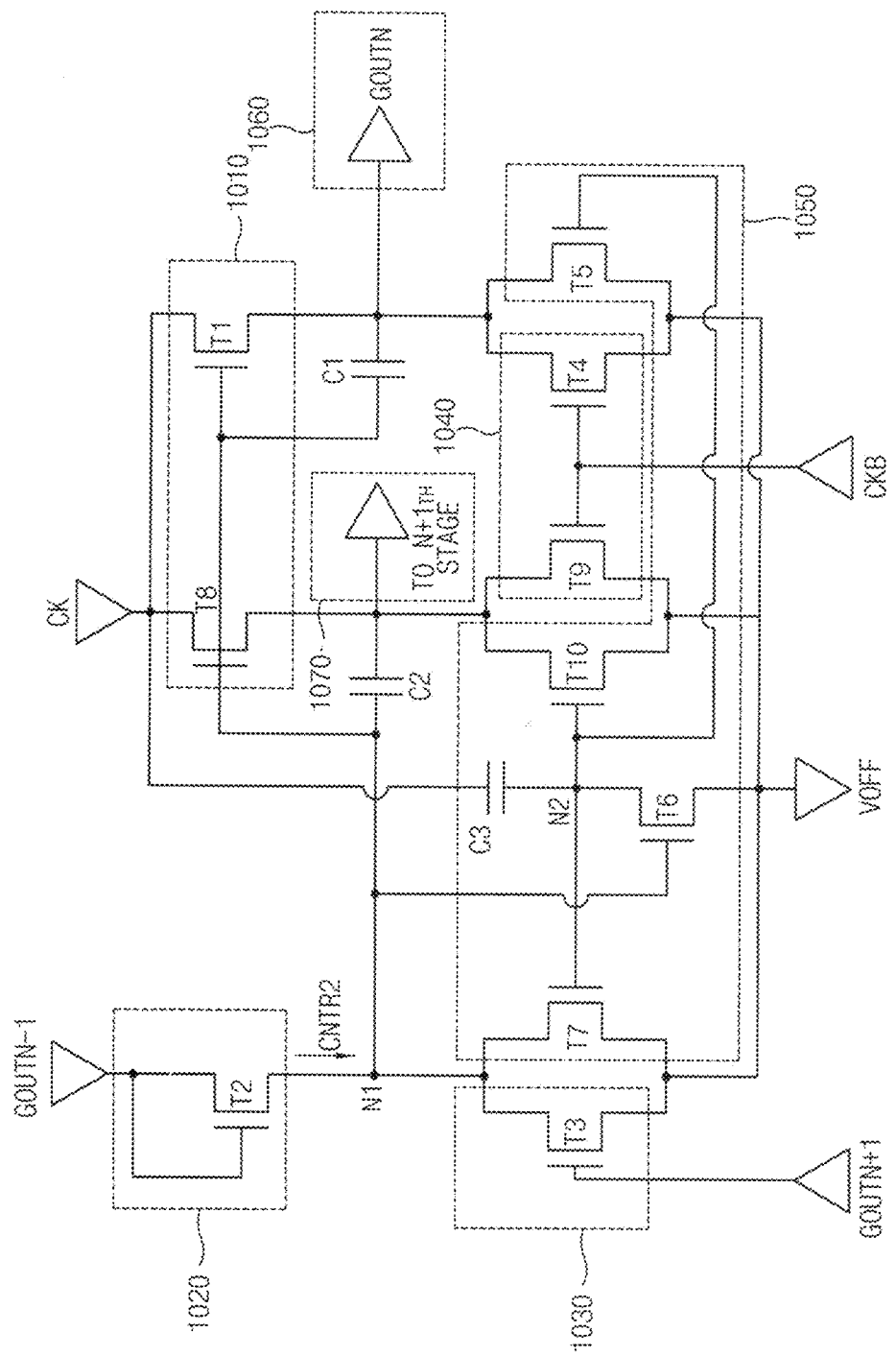
FIG. 10 is a circuit diagram illustrating an example stage of the shift register in FIG. 7 according to another example embodiment of the present invention.

FIG. 10 is a circuit diagram illustrating an example stage of the shift register in FIG. 7 according to another example embodiment of the present invention.

Referring to FIG. 10, the example stage (e.g., Nth stage) of the shift register includes a pull up drive section 1010, a first pull up drive control section 1020, a second pull up drive control section 1030, a pull down drive section 1040 and a maintaining section 1050.

The pull up drive section 1010 includes switching elements, such as a first transistor T1 and an eighth transistor T8. The first clock signal CK is applied to drain electrodes of the first and eighth transistors T1 and T8. Gate electrodes of the first and eighth transistors T1 and T8 are connected to a node N1, thereby being controlled by a control signal CNTR2. A source electrode of the first transistor T1 is connected to an output terminal 1060 of the Nth stage, and a source electrode of the eighth transistor T8 is connected to a carry output terminal 1070 of the Nth stage.

Additionally, a first capacitor C1 is coupled between the source electrode and the gate electrode of the first transistor T1. A second capacitor C2 is coupled between the source electrode and gate electrode of the eighth transistor T8. The first and second capacitors C1 and C2 may correspond to a parasitic capacitor or an additionally installed capacitor. For example, the first and second capacitors C1 and C2 store an electric charge corresponding to the control signal CNTR2 at the node N1 to perform a boot-strap operation, so that overlap area between the gate electrode and the source electrode is larger than overlap area between the gate electrode and the drain electrode in the first and eighth transistors T1 and T8. The first and eighth transistors T1 and T8 may be implemented with NMOS transistors.

The first pull up drive control section 1020 includes a switching element, such as a second transistor T2 whose drain electrode and gate electrode are commonly connected to each other. The second transistor T2 receives a gate signal GOUTN−1 of an N−1th stage and outputs the control signal CNTR2 to the node N1. Assuming that the Nth stage is the first stage, the start scan signal STV is applied to the second transistor T2 of the first pull up drive control section 1020. The second transistor T2 may be implemented with an NMOS transistor.

The second pull up drive control section 1030 includes a switching element, for example, a third transistor T3. A gate electrode of the third transistor T3 receives a gate signal GOUTN+1 outputted from an output terminal of an N+1th stage. A drain electrode of the third transistor T3 is connected to the node N1 and thereby connected to the gate electrode of the first transistor T1. A source electrode of the third transistor T3 is connected to the first voltage VOFF (or VSS).

When the third transistor T3 is turned on in response to the gate signal GOUTN+1 outputted from the output terminal of the N+1th stage, the first voltage VOFF (or VSS) is provided to the node N1. The third transistor T3 may be implemented with an NMOS transistor.

The output terminal 1060 of the Nth stage of the shift register is connected to the second pull up drive control section 1030 of an N−1th stage, and outputs a gate signal GOUTN of the Nth stage.

The pull down drive section 1040 includes switching elements, such as a fourth transistor T4 and a ninth transistor T9. Gate electrodes of the fourth and ninth transistors T4 and T9 receive the second clock signal CKB, and source electrodes thereof are connected to the first voltage VOFF (or VSS). A drain electrode of the fourth transistor T4 is connected to the source electrode of the first transistor T1 of the pull up drive section 1010 and the output terminal 1060 of the Nth stage. A drain electrode of the ninth transistor T9 is connected to the source electrode of the eighth transistor T8 of the pull up drive section 1010 and the carry output terminal 1070 of the Nth stage. The pull down drive section 1040 is controlled by the second clock signal CKB to inactivate a gate line and a carry signal line. The second clock signal CKB that is an AC pulse signal rather than a DC signal is used to control the gate electrodes of the fourth and ninth transistors T4 and T9, so that the fourth and ninth transistors T4 and T9 may be prevented from being deteriorated. The fourth and ninth transistors T4 and T9 may be implemented with NMOS transistors.

The maintaining section 1050 includes switching elements, such as a fifth transistor T5, a sixth transistor T6, a seventh transistor T7 and a tenth transistor T10, and a third capacitor C3.

Each gate electrode of the fifth, seventh and tenth transistors T5, T7 and T10 is connected to a node N2, and each source electrode thereof is connected at the first voltage VOFF (or VSS). The first clock signal CK is applied to one end of the third capacitor C3. Each gate electrode of the fifth, seventh and tenth transistors T5, T7 and T10 is connected to a drain electrode of a sixth transistor T6.

Therefore, when the sixth transistor T6 is turned on, the fifth, seventh and tenth transistors T5, T7 and T10 are turned off in response to the first voltage VOFF (or VSS). When the sixth transistor T6 is turned off, the fifth, seventh and tenth transistors T5, T7 and T10 are turned on in response to the first clock signal CK that is charged in the third capacitor C3, thereby outputting the first clock signal CK to the node N1, the carry output terminal 1070 and the output terminal 1060 of the Nth stage.

The maintaining section 1050 outputs the first clock signal CK as the gate signal GOUTN and the carry signal to an Nth gate line until an N+1th gate line is activated. Therefore, the maintaining section 1050 prevents the gate line from receiving a malfunction signal until the next scanning cycle.

In this embodiment, an AC pulse signal is applied as the clock signal to the gate electrodes of the fourth and ninth transistors T4 and T9 of the pull down drive section 1040, so that the deterioration of the fourth and ninth transistors T4 and T9, which would have been caused by a DC voltage, may be reduced or prevented. Therefore, output from the output terminal 1060 and the carry output terminal 1070 is maintained by operation of the fourth and fifth transistors T4 and T5 and ninth and tenth transistors T9 and T10 that are turned on in response to the first and second clock signals CK and CKB.

The first and second clock signals CK and CKB are alternately applied to the first and second clock terminals CK1 and CK2 of the respective stages ASRC1, ASRC2, . . . ASRCN and ASRC+X.

In this embodiment, each of the stages ASRC1, ASRC2, . . . ASRCN and ASRC+X receives the output signals GOUT1, GOUT2, . . . GOUTN and GDUMMY outputted from the nearest stages (i.e., preceding stage and/or the next stage). However, in the alternative embodiment, each of the stages ASRC1, ASRC2, . . . ASRCN and ASRC+X may receive the output signals GOUT1, GOUT2, . . . GOUTN and GDUMMY outputted from any preceding and/or following stages. For example, an Mth stage may receive an output signal GOUTM+2 outputted from an M+2th stage and/or an output signal GOUTM−2 outputted from an M−2th stage.

Figure 11:
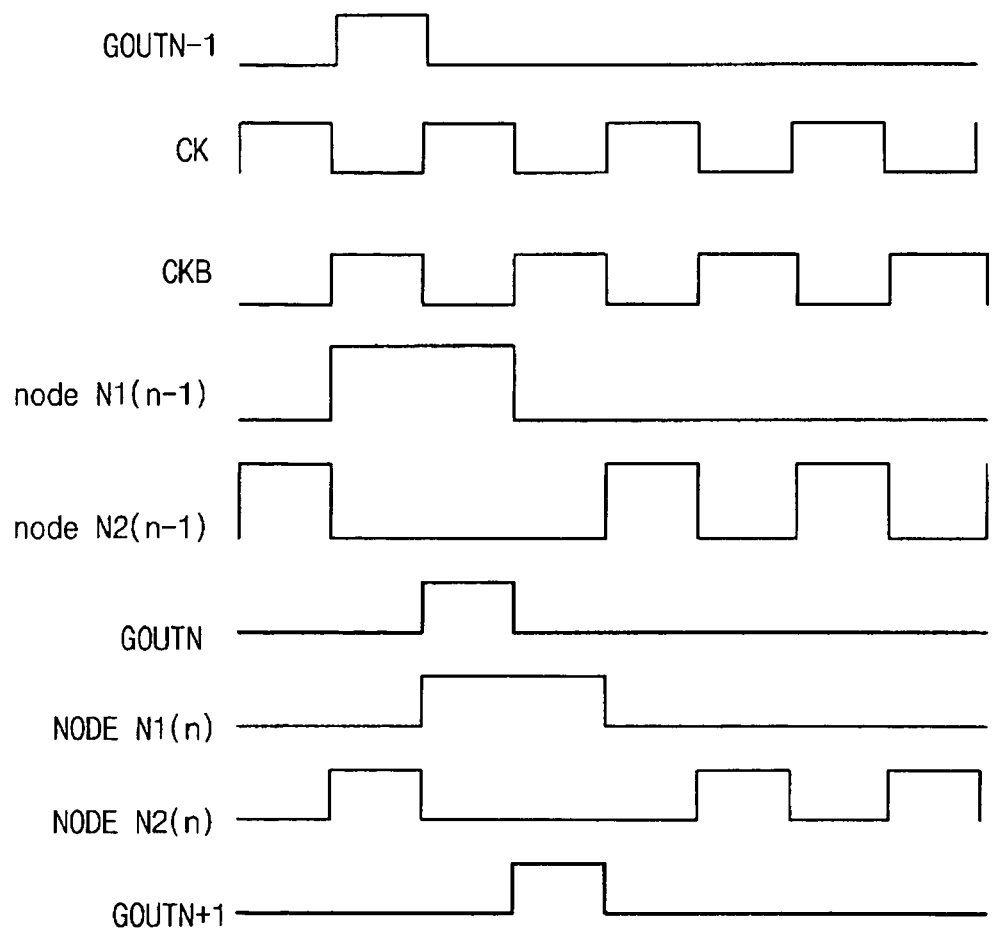
FIG. 11 is a timing diagram illustrating an output of the shift register in FIG. 10.

FIG. 11 is a timing diagram illustrating signals of the shift register in FIG. 10.

Referring to FIG. 11, gate signals GOUTN−1, GOUTN and GOUTN+1 of the stages of the shift register are generated in synchronization with the first and second clock signals CK and CKB.

It is to be understood that the shift register of the present invention may be applied to various flat display devices such as a liquid crystal display (LCD), an organic electro-luminescent (organic EL), etc.

As described above in the embodiments of the present invention, the first clock signal, the second clock signal, and the output signal of an adjacent stage are applied to the respective stages of the shift register, so that a marginal size of the display panel employing such shift register may be reduced using a relatively small number of switching members.

In addition, the shift register may improve reliability of a display device by using two clock signals as input signals of respective stages of the shift register. Also, the shift register may further improve the reliability by using two clock signals that are AC pulse signals rather than DC signals. The shift register may also improve the reliability by using a carry signal of a preceding stage as an input signal of the respective stages.

Having thus described example embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A shift register having stages each generating a gate signal, each of the stages comprising:
   a first pull up drive control section configured to output a control signal in response to the gate signal of an adjacent stage;
   a pull up drive section configured to receive a first clock signal and to output the first clock signal as the gate signal to a corresponding gate line in response to the control signal; and
   a pull down drive section configured to inactivate the corresponding gate line in response to a second clock signal,
   wherein the second clock signal is directly applied to the pull down drive section, and the pull down drive section includes a transistor comprising:
      a gate electrode to which the second clock signal is directly applied;
      a source electrode to which a gate turn-off voltage being maintained only at a first level is applied; and
      a drain electrode connected to an output terminal connected to the corresponding gate line.

2. The shift register of claim 1, further comprising a second pull up drive control section that is electronically connected to the pull up drive section and configured to operate in response to the gate signal of a next stage.

3. The shift register of claim 2, wherein a transistor of the pull down drive section outputs a first voltage in response to the second clock signal.

4. The shift register of claim 3, wherein the second pull up drive control section includes a transistor that provides the first voltage to a gate electrode of a transistor in the pull up drive section.

5. The shift register of claim 4, wherein the first voltage corresponds to a gate turn-off voltage.

6. The shift register of claim 1, wherein the first pull up drive control section includes a transistor of which drain electrode and gate electrode are commonly connected to each other, the drain and gate electrodes receiving the gate signal of the adjacent stage.

7. The shift register of claim 1, wherein the pull up drive section includes a first transistor of which drain electrode and gate electrode are commonly connected to each other and source electrode is connected to the pull down drive section, the drain and gate electrodes of the transistor of the pull up drive section receiving the first clock signal.

8. The shift register of claim 7, wherein the pull up drive section further includes a second transistor that generates a carry signal in response to the first clock signal.

9. The shift register of claim 8, wherein the carry signal of the pull up drive section is applied to an input terminal of a next stage.

10. The shift register of claim 1, wherein the first clock signal and the second clock signal have phases different from each other.

11. The shift register of claim 10, wherein the first clock signal has a phase which is about 180 degrees from a phase of the second clock signal.

12. The shift register of claim 10, wherein the first and second clock signals are alternately applied to clock terminals of the respective stages.

13. The shift register of claim 1, wherein the first level is one of a ground voltage level and a negative voltage level.

14. A display device for displaying images, the display device comprising:
   a display panel having gate lines, data lines, display members, and switching members;
   a timing controller configured to output image data, gate control signals, and data control signals;
   a shift register configured to sequentially output gate signals to the gate lines in response to the gate control signals; and
   a data drive circuit configured to output data signals to the data lines in response to the data control signals,
   wherein the shift register includes stages corresponding to the gate lines, each of the stages outputting a first clock signal as a gate signal to a corresponding gate line in response to the gate signal of an adjacent stage and inactivating the corresponding gate line in response to a second clock signal,
   wherein the shift register includes a transistor comprising:
      a gate electrode to which the second clock signal is directly applied;
      a source electrode to which a gate turn-off voltage being maintained only at a first level is applied; and
      a drain electrode connected to an output terminal connected to the corresponding gate line.

15. The display device of claim 14, wherein the shift register is formed on the display panel.

16. The display device of claim 14, wherein the gate signals are provided to the shift register via a wiring in the display panel.

17. The display device of claim 14, wherein the first clock signal and the second clock signal have phases different from each other.

18. The display device of claim 17, wherein the first and second clock signals are alternately applied to clock terminals of the respective stages.

19. The display device of claim 14, wherein the first clock signal has a phase which is about 180 degrees from a phase of the second clock signal.

20. The display device of claim 14, the first level is one of a ground voltage level and a negative voltage level.

21. A shift register having stages each generating a gate signal for a gate line, each of the stages comprising:
   a first pull up drive control section configured to output a control signal in response to the gate signal of an adjacent stage;
   a pull up drive section configured to receive a first clock signal and to output the first clock signal as the gate signal to a corresponding gate line in response to the control signal;
   a pull down drive section configured to inactivate the gate line in response to a second clock signal, wherein the second clock signal is directly applied to the pull down drive section; and
   a maintaining section configured to maintain an inactivated state of the gate line in response to the first clock signal, wherein the maintaining section includes a capacitor to which the first clock signal is directly applied.

22. The shift register of claim 21, further comprising a second pull up drive control section that is electronically connected to the pull up drive section and configured to operate in response to the gate signal of a next stage.

23. The shift register of claim 22, wherein the second pull up drive control section includes a transistor that provides a first voltage to a gate electrode of a transistor in the pull up drive section in response to the gate signal of a next stage.

24. The shift register of claim 23, wherein the first voltage corresponds to a gate turn-off voltage.

25. The shift register of claim 21, wherein the pull up drive section includes a first transistor of which drain electrode receives the first clock signal and source electrode is electronically connected to the pull down drive section and an output terminal of the stage.

26. The shift register of claim 25, wherein the pull up drive section further includes a second transistor that generates a carry signal in response to the first clock signal.

27. The shift register of claim 26, wherein the carry signal of the pull up drive section is applied to an input terminal of a next stage.

28. The shift register of claim 21, wherein the first pull up drive control section includes a transistor of which drain electrode and gate electrode are commonly connected to each other, the drain and gate electrodes of the transistor of the first pull up drive control section receiving a gate signal of the adjacent stage.

29. The shift register of claim 21, wherein the maintaining section includes,
transistors operating in response to the control signal and the first clock signal of which electric charge is stored in the capacitor.

30. The shift register of claim 21, wherein the first clock signal and the second clock signal have phases different to each other.

31. The shift register of claim 30, wherein the first clock signal has a phase about 180 degrees from a phase the second clock signal.

32. The shift register of claim 31, wherein the first and second clock signals are alternately applied to clock terminals of the respective stages.

33. A display device for displaying images, the display device comprising:
a display panel having gate lines, data lines, display members, and switching members;
a timing controller configured to output image data, gate control signals, and data control signals;
a shift register configured to sequentially output gate signals to the gate lines in response to the gate control signals; and
a data drive circuit configured to output data signals to the data lines in response to the data control signals,
wherein the shift register includes stages corresponding to the gate lines, each of the stages outputting a first clock signal as a gate signal to a corresponding gate line in response to the gate signal of an adjacent stage, inactivating the corresponding gate line in response to a second clock signal, and maintaining an inactive state of the corresponding gate line in response to the first clock signal,
wherein the shift register includes a transistor comprising:
a gate electrode to which the second clock signal is directly applied;
a source electrode to which a gate turn-off voltage being maintained only at a first level is applied; and
a drain electrode connected to an output terminal connected to the corresponding gate line.

34. The display device of claim 33, wherein the shift register is formed on the display panel.

35. The display device of claim 33, wherein the gate signals are provided to the shift register via a wiring in the display panel.

36. The display device of claim 33, wherein the first clock signal and the second clock signal have phases different from each other.

37. The display device of claim 36, wherein the first clock signal has a phase about 180 degrees from a phase of the second clock signal.

38. The shift register of claim 37, wherein the first and second clock signals are alternately applied to clock terminals of the respective stages.

39. The display device of claim 33, wherein the first level is one of a ground voltage level and a negative voltage level.

* * * * *